United States Patent [19]
Iyotani et al.

[11] Patent Number: 5,424,937
[45] Date of Patent: Jun. 13, 1995

[54] GATE DRIVE POWER SOURCE FOR ELECTRIC POWER CONVERTER

[75] Inventors: Ryuji Iyotani, Hitachiota; Akiteru Ueda, Ibaraki; Hiroshi Narita; Mitsuyuki Hombu, both of Katsuta; Hidetoshi Aizawa, Ibaraki, all of Japan

[73] Assignee: Hitachi, Ltd., Tokyo, Japan

[21] Appl. No.: 73,392

[22] Filed: Jun. 9, 1993

[30] Foreign Application Priority Data

Jun. 10, 1992 [JP] Japan .................. 4-150371

[51] Int. Cl.⁶ .......................................... H02M 7/521
[52] U.S. Cl. ........................................................ 363/136
[58] Field of Search ............... 363/125, 135, 136, 127, 363/131, 132, 65, 67, 69

[56] References Cited

U.S. PATENT DOCUMENTS

| | | | |
|---|---|---|---|
| 3,070,738 | 12/1962 | Meys | 363/69 |
| 4,441,032 | 4/1984 | Sakurai et al. | 363/69 X |

FOREIGN PATENT DOCUMENTS

| | | |
|---|---|---|
| 3915510A1 | 11/1990 | Germany . |
| 55-32449 | of 0000 | Japan . |
| 53-40860 | of 0000 | Japan . |
| 63-124777 | of 0000 | Japan . |
| 53-40860 | 10/1978 | Japan . |
| 55-32449 | 3/1980 | Japan . |
| 63-124777 | 5/1988 | Japan . |
| 2228844 | 9/1990 | United Kingdom . |

OTHER PUBLICATIONS

European Search Report (3 pages) Apr. 27, 1994.
"A Low Loss Turn-on Turn-off Snubber for GTO-Inverters", Conference Record of the 1987 IEEE Industry Applications Society Annual Meeting, Part I, pp. 607–612.

*Primary Examiner*—Thomas M. Dougherty
*Attorney, Agent, or Firm*—Antonelli, Terry, Stout & Kraus

[57] ABSTRACT

An electric power converter comprising a plurality of reactors, a plurality of self quenching type switching elements, the reactors and switching elements being series-connected per one arm, and surge-absorbing snubber circuits connected in parallel to the switching elements respectively, the switching circuits being driven by gate drive circuits connected to respective gates of the switching elements to thereby convert a DC voltage into an AC voltage or convert an AC voltage into a DC voltage. The electric power converter further comprises: an apparatus for recovering energy accumulated on at least one side of the reactors and the snubber circuits and an apparatus for generating a DC source for supplying electric power to each of the gate drive circuits, on the basis of the recovered energy. In the electric power converter constituted by a plurality of self quenching type semiconductor switching elements connected in series, high efficiency is attained through reduction in size of the gate driver and electric power saving.

9 Claims, 7 Drawing Sheets

GATE DRIVE POWER SOURCE FOR ELECTRIC POWER CONVERTER

BACKGROUND OF THE INVENTION

The present invention relates to an electric power converter for DC power transmission and frequency conversion and particularly relates to a high-voltage large-capacity electric power converter having a structure in which a plurality of self quenching type switching elements per one arm are connected in series.

With respect to gate electric sources adapted to switching elements for driving a high-voltage large-capacity electric power converter of the type having a structure in which a plurality of semiconductor switching elements are connected in series, there are a method in which insulation transformers are series-connected from the ground side so that respective gate drive circuits are supplied with electric power from the secondary side of the transformers as described in JP-Y 2-31909, and a method in which a gate power source is obtained from the potential of a main circuit in an apparatus using a thyristor as described in JP-B 53-40860. As another method, there is a method in which a gate power source is obtained from a main circuit through a current transformer on the basis of a snubber circuit current as described in JP-A 55-32449 and JP-A 63-124777.

However, for example, in a high-voltage large-capacity electric power converter for DC power transmission and frequency conversion as used in an electric power system, for example, the value of DC voltage reaches 125 kV. In the case where a 4.5 kV-grade large-capacity gate turn-off thyristor (hereinafter referred to as "GTO") is used as a self quenching type semiconductor element, the number of series-connected GTOs approaches 100 per one arm. Accordingly, in the case where an electric source for each of gate drive circuits for driving the GTOs is to be obtained from the series-connected insulation transformers, the capacity of an insulation transformer located in the lowermost stage from the ground side becomes a multiple of a capacity corresponding to the number of switching elements or corresponding to the number of modules each constituted by a plurality of series-connected switching elements so that apparatus size becomes large compared with the capacity of an insulation transformer located in the uppermost stage. In a method in which insulation transformers are provided correspondingly to respective potential values, the transformers can be provided so as to be equal in capacity but insulation between the primary winding (ground side) and the secondary winding (apparatus side) cannot be made easily. Further, gate drive electric power for a thyristor is required only at the time of turning-on thereof while gate drive electric power for a GTO is required both at the time of turning-on and at the time of turning-off. As the GTO device capacity increases or as the carrier frequency of the apparatus increases, the drive electric power increases. For example, in the case of the above-mentioned high-voltage large-capacity electric power converter, if electric power required for the gate of a 4.5 kV-3 kA-grade GTO is 200 W in the condition of 100 series-connected GTOs per one arm, three-phase bridge connection and carrier frequency of 500 Hz, the number of GTOs becomes 600. Accordingly, gate drive electric power required for the apparatus as a whole becomes 120 kW as bulk power. Therefore, the method in which a gate electric source is obtained from a main circuit, as described in the prior art, is considered. However, in the case where a self quenching type semiconductor switching element such as a GTO is to be driven, an idea different from the idea required for the thyristor is required so that it is necessary to apply an inverse-bias voltage to the gate in order to prevent maloperation before a voltage is applied to the main circuit. As a method for obtaining a gate electric source under the consideration of these problems, nothing has been described specifically.

SUMMARY OF THE INVENTION

An object of the present invention is to provide a high-voltage large-capacity electric power converter constituted by a plurality of self quenching type semiconductor switching elements connected in series, in which high efficiency of the converter can be attained through reduction in size and saving of electric power in a gate driver for driving the semiconductor switching elements.

The foregoing object of the invention is attained by an electric power converter comprising a plurality of reactors, a plurality of self quenching type switching elements, the reactors and switching elements being series-connected per one arm, and surge-absorbing snubber circuits connected in parallel to the switching elements respectively, the switching circuits being driven by gate drive circuits connected to respective gates of the switching elements to thereby convert a DC voltage to an AC voltage or convert an AC voltage to a DC voltage, wherein the electric power converter further comprises means for recovering energy accumulated on the reactors and the snubber circuits, means for generating a DC source for supplying electric power to each of the gate drive circuits on the basis of the recovered energy, and a sub power source connected in parallel to the DC source and constituted by a battery for supplying electric power to each of the gate drive circuits.

An electric source for each of the gate drive circuits for the plurality of series-connected semiconductor switching elements is generated from energy accumulated on the reactor and the snubber circuit to thereby reduce the potential difference between the electric source and the semiconductor switching element. Accordingly, not only the insulating process in the gate driver including the electric source can be lightened but reduction in size can be attained. Further, in the above-mentioned method, there is no necessity of supplying electric power from the outside. Accordingly, not only greater reduction in size of the gate drive circuit can be attained but high efficiency as a whole of the electric power converter can be attained. Further, because the sub power source supplies electric power to the gate drive circuit only when the DC voltage is not established at the time of the starting-up of the electric power converter, the capacity thereof can be selected to be small. In the case where a secondary battery is used as the sub power source, the battery is charged by the above-mentioned DC source at the time of constant operation. There arises an effect that no special electric charger is required.

BRIEF DESCRIPTION OF THE DRAWINGS

FIG. 12 is a configuration diagram of part of a main circuit of an electric power converter showing a further embodiment of the present invention.

DESCRIPTION OF THE PREFERRED EMBODIMENTS

Figure 1:
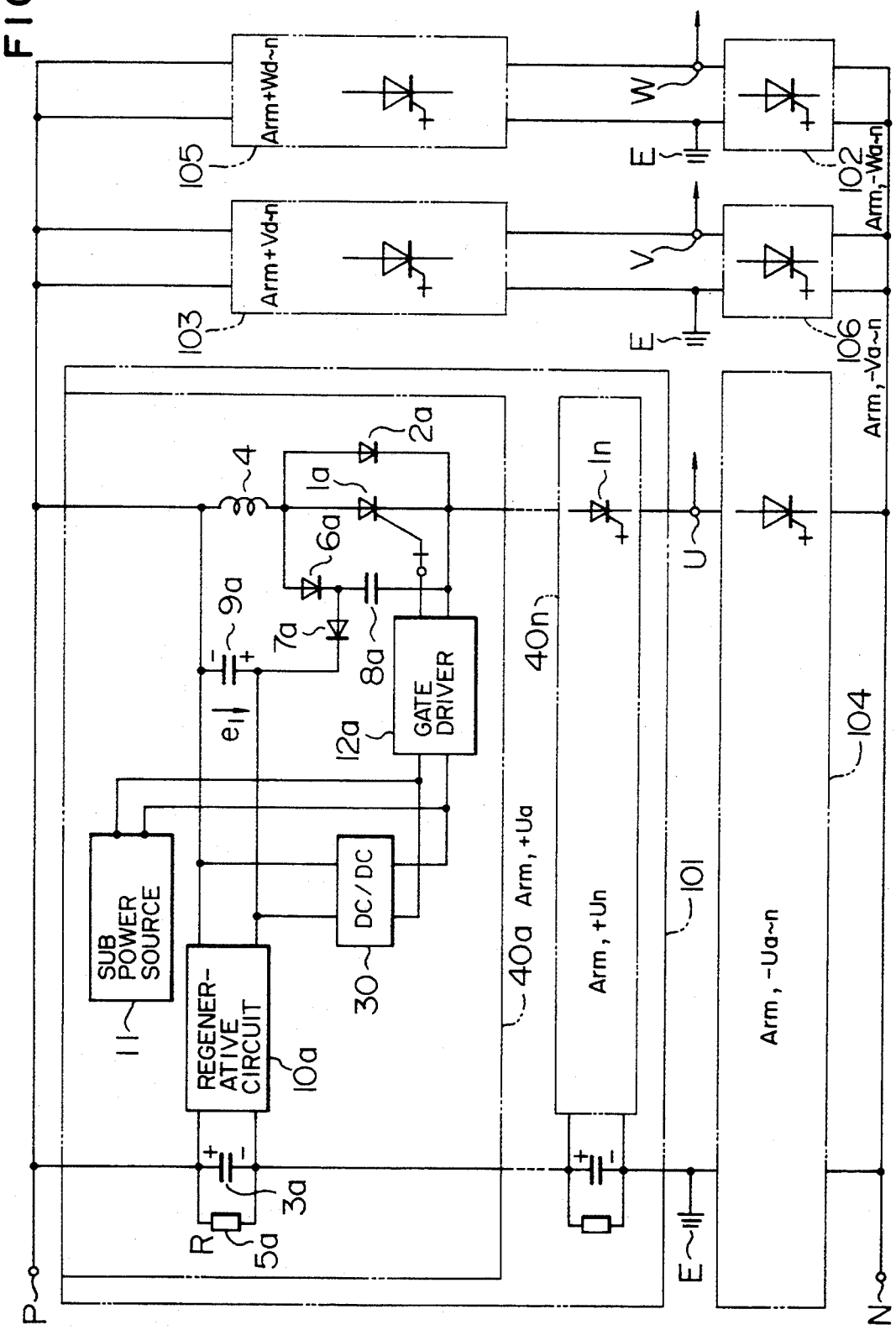
FIG. 1 is a configuration diagram of a main circuit of an electric power converter showing an embodiment of the present invention.

FIG. 1 shows a main circuit configuration of an electric power converter (popularly called "inverter") for converting AC power into DC power, to which an embodiment of the present invention is applied. In FIG. 1, a three-phase voltage type inverter is shown as an example. A plurality of self quenching type semiconductor switching elements are series-connected to each of six arms 101–106. In this drawing, GTO is used as an example of the semiconductor switching element. In the drawing, P represents a positive side terminal of the inverter, N represents a negative side terminal of the inverter, and U, V and W represent three-phase AC terminals connected to load sides respectively. A plurality of smoothing capacitors 3a are series-connected between the terminals P and N. An intermediate point E of the connection is connected to the ground.

The internal structure of each arm will be described below on the basis of the U-phase positive side arm 101 taken as an example because the arms 101–106 are the same in structure. A number n of GTOs 1a–1n are series-connected per one arm. The reference numeral 40a designates a circuit which includes a GTO 1a and attendant peripheral circuits. Circuits equivalent to the circuit 40a are provided correspondingly to the number of GTOs. That is, circuits 40a–40n are provided. The structure of the circuit 40a which is one of the circuits 40a–40n will be described below. An anode reactor 4 is series-connected to the GTO 1a and for suppressing the ascension rate and overcurrent state of electric current flowing in the GTO. Further, a snubber circuit constituted by a series circuit of a diode 6a and a capacitor 8a, and a feedback diode 2a are connected in parallel to the GTO. The snubber circuit is provided for suppressing the ascension rate and overvoltage state of voltage applied to the GTO. A junction between the diode 6a and the capacitor 8a in the snubber circuit and an end of a capacitor 9a are connected to each other through a diode 7a with polarity shown in the drawing. Opposite ends of the capacitor 9a are connected to not only the input side of a regenerative circuit 10a but the input side of a DC—DC converter 30 which receives a predetermined range of DC input voltages and outputs a constant DC voltage. The output side of the converter 30 is connected to the input side of a gate drive circuit 12a. The input side voltage of the regenerative circuit 10a is generally controlled by the regenerative circuit 10a so as to be kept substantially in a predetermined DC voltage value $e_1$. Further, a sub power source 11 such as a battery is connected to the input side of the gate drive circuit 12a. The output side of the regenerative circuit 10a is connected to opposite ends of the smoothing capacitor 3a. The reference numeral 5a designates a voltage dividing resistor for dividing a voltage equally.

Figure 2:
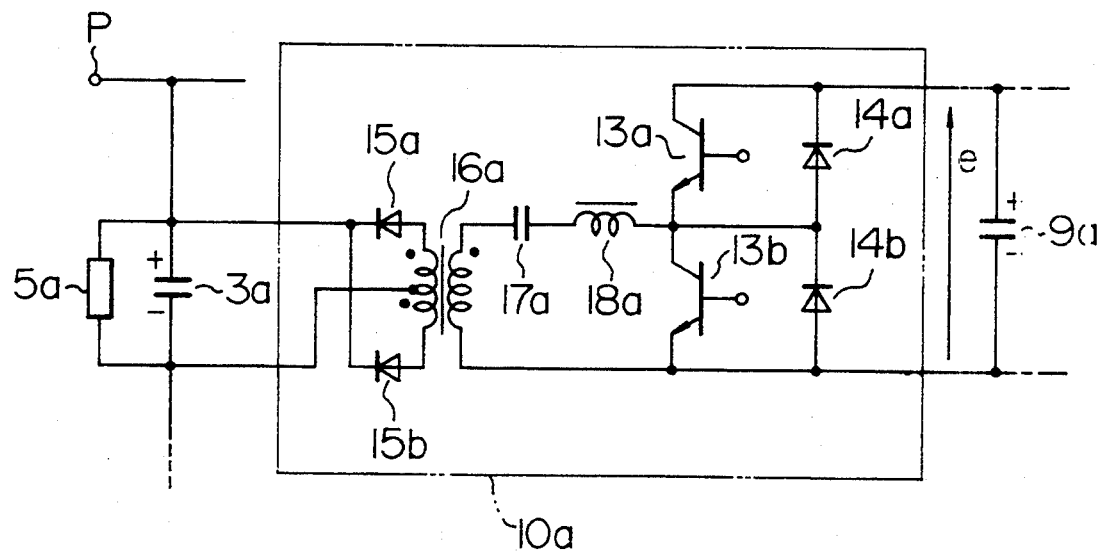
FIG. 2 shows a regenerative circuit in the embodiment of the present invention.

FIG. 2 shows the detail of the regenerative circuit 10a in the embodiment of the present invention shown in FIG. 1. The regenerative circuit is a circuit for regenerating energy to a PN side DC source. The circuit shown in this drawing is a known circuit which is called "DC—DC converter". In this embodiment, this circuit is shown as a series resonance type circuit. Briefly describing the operation of this circuit, when semiconductor switches 13a and 13b connected in parallel to feedback diodes 14a and 14b are turned on and off alternately with a capacitor 9a as a power source (voltage $e_1$), a resonance current (AC current) flows in the primary side of a potential transformer 16a through a capacitor 17a and a reactor 18a. The current is rectified by diodes 15a and 15b on the secondary side of the potential transformer 16a, so that the rectified current is regenerated to the smoothing capacitor 3a.

Figure 3:
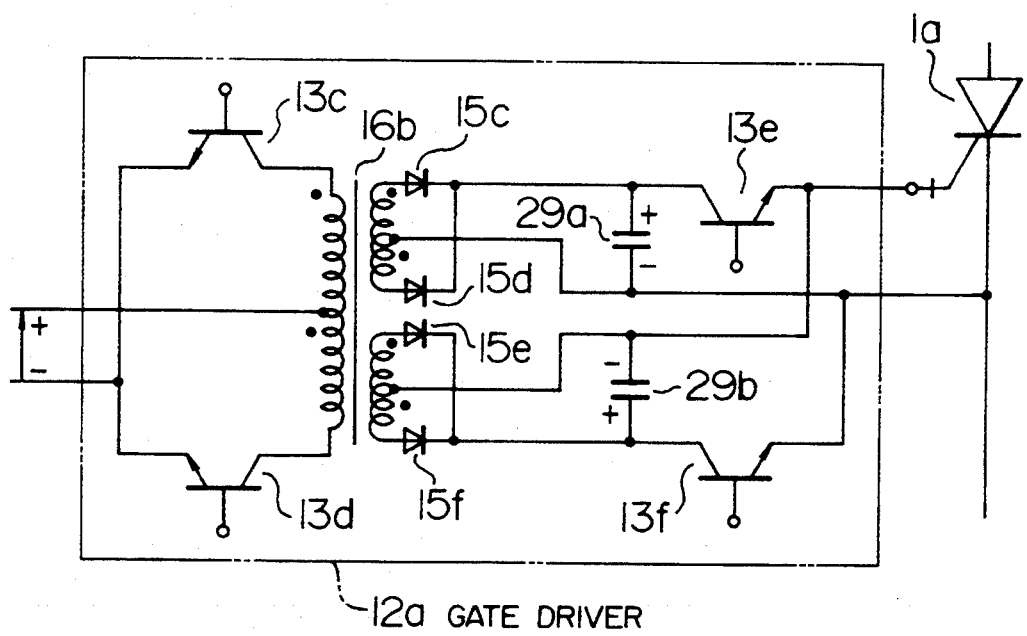
FIG. 3 shows a gate drive circuit in the embodiment of the present invention.

FIG. 3 shows the detail of the gate drive circuit 12a in the embodiment of the present invention shown in FIG. 1. This circuit is also a kind of DC—DC converter. The primary winding side of a potential transformer 16b is formed so as to be of a push-pull type. By turning on and off semiconductor switches 13c and 13d alternately while using an input supplied from the converter 30 as an electric source, a high-frequency AC voltage is generated. Voltages generated on the basis of the voltage are rectified by diodes 15c–15f on the secondary side of the potential transformer 16b and charged in an on-source capacitor 29a and an off-source capacitor 29b respectively. On the basis of a signal from a control circuit not shown, a semiconductor switch 13e is turned on in the case of an on-gate signal or a semiconductor switch 13f is turned on in the case of an off-gate signal so that a gate signal is transmitted to the GTO.

The operation of the embodiment of the present invention will be described below. First, in the state in which the GTO 1a is off, the capacitor 8a in the snubber circuit is charged with a voltage obtained by dividing the DC voltage between the terminals P and N by the number in series connection of GTOs. When the GTO 1a is turned on, the energy accumulated on the capacitor 8a is supplied to the capacitor 9a through a closed circuit of capacitor 8a—diode 7a—capacitor 9a (the primary side of the regenerative circuit 10a)—anode reactor 4—GTO 1a so that the capacitor 9a is charged. The charge energy is regenerated to the source-side smoothing capacitor 3a through the regenerative circuit 10a till the voltage of the capacitor 9a reaches a predetermined value.

When the GTO 1a is then turned off, the energy accumulated on the anode reactor 4 is supplied to the capacitor 8a so that the capacitor 8a is charged. In the case where the total capacitor voltage in the snubber circuit per one arm exceeds the DC voltage inputted to the inverter, the energy is fed to the regenerative circuit through a closed circuit of anode reactor 4—diode 6a—diode 7a—capacitor 9a. That is, energy accumulated on the anode reactor and the snubber circuit is fed to the regenerative circuit whenever the GTO is turned on and off. Accordingly, part of the energy is fetched in the input of the gate drive circuit 12a as shown in the drawing so as to be used as gate drive power for driving the GTO. According to a trial, electric power required for gate driving is not larger than several % of the energy accumulated on the anode reactor and the snubber circuit. As described above, when the electric power converter is in operation, gate drive power for driving the GTO can be supplied sufficiently from the main circuit. There is however the necessity of consideration of the following point at the time of starting-up of the electric power converter. That is, though an electric source voltage must be established in order to start up the inverter, an overcurrent may flow in the GTO because of ignition by mistake when an electric source voltage is supplied to the gate terminal of the GTO which has been not supplied with an inverted bias voltage. Further, because there is no gate power obtained from the main circuit at the initial stage of the starting-up, gate drive electric power enough for turning on and off the GTO is required in a period of several cycles till constant gate power is supplied. Therefore, as shown in FIG. 1, a sub power source 11 is connected to the input side of the gate drive circuit 12a. As the power source 11, a secondary battery is used. The secondary battery is preliminarily charged before the starting-up of the electric power converter, so that the battery is used as a power source for generating the above-mentioned inverted bias voltage and gate drive power at the initial stage of the starting-up and as a power source for controlling the regenerative circuit 10a and the gate drive circuit 12a. Because the electric power is sufficiently smaller than the gate power required for turning on and off the GTO constantly, the secondary battery can be used sufficiently. Alternatively, a primary battery such as a solar cell may be used as the sub power source 11. In the case of a solar cell, the battery does not need charging because it always absorbs peripheral light energy and converts the light energy into electric power. Further, if the solar cell and the above-mentioned secondary battery are used in combination, charging of the secondary battery before the starting-up is not required. Alternatively, an insulation transformer may be series-connected from the ground side so that secondary side outputs of the insulation transformer having respective potential values are rectified to be used as sub power sources. In this case, there arises a problem in insulation between the primary and secondary sides of the insulation transformer, but the capacity of the transformer can be reduced so that the size thereof can be reduced because there is no necessity of constantly supplying gate drive power for turning on and off the GTO.

As described above, in this embodiment, when energy generated in the main circuit portion of the anode reactor and the snubber circuit is regenerated to the power source by the regenerative circuit in a period of operation of the converter, part of the energy is used as gate drive power. Accordingly, there is no necessity of supplying electric power from the outside, so that high efficiency as a whole of the electric power converter can be attained.

Further, a gate drive power source is generated from the main circuit portion of the anode reactor and the snubber circuit, so that potential difference between the power source and the gate of the GTO is reduced. Accordingly, an insulating process in the gate driver including the power source can be reduced, so that reduction of size can be attained.

Figure 4:
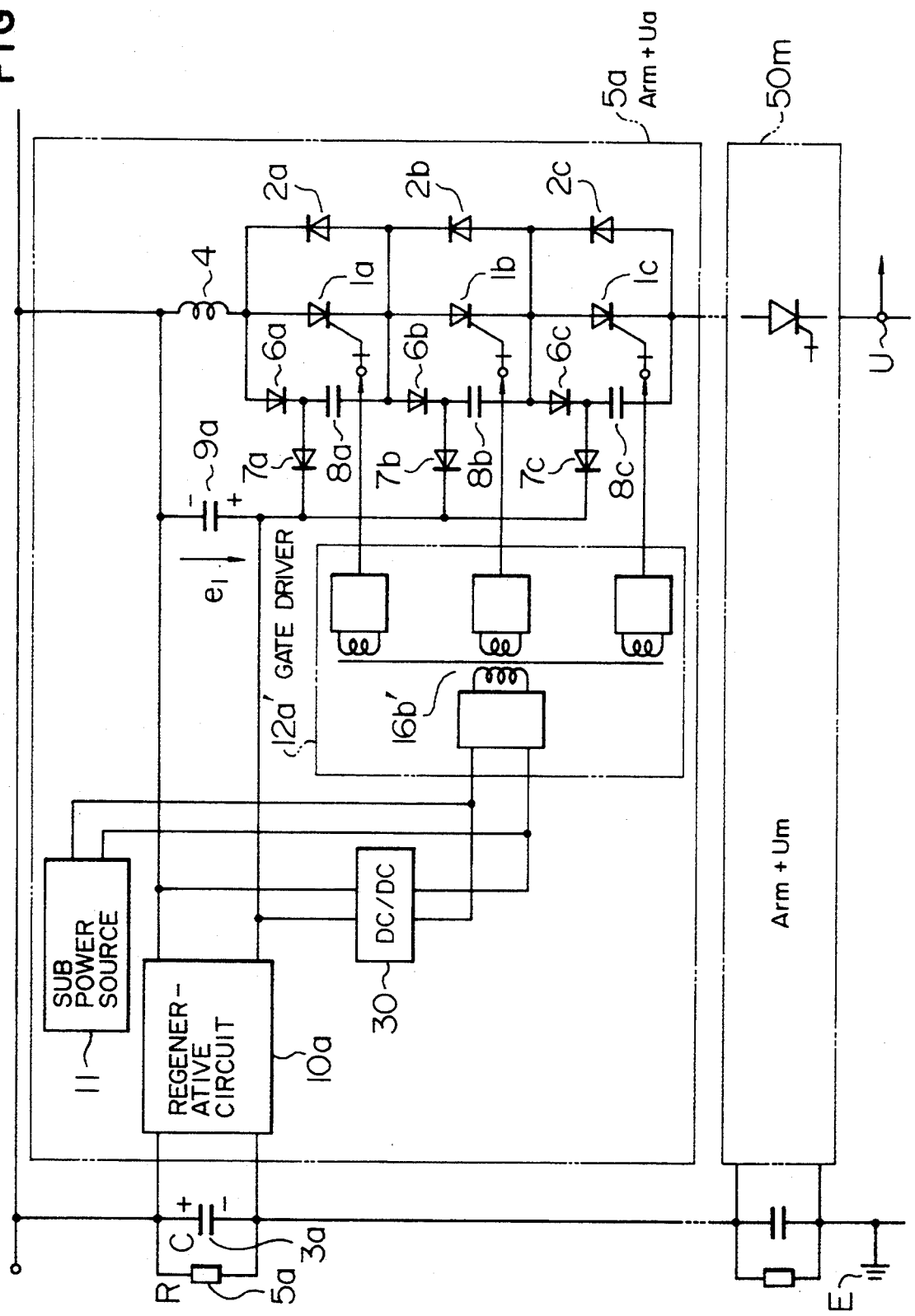
FIG. 4 is a configuration diagram of part of a main circuit of an electric power converter showing another embodiment of the present invention.

FIG. 4 shows the structure of part of the main circuit according to another embodiment of the present invention. One unit constituted by a plurality of GTOs being series-connected and attendant parts, necessary on circuitry, being connected to the GTOs is now referred to as "module". Because the number of series-connected GTOs is large in practical use of a large-capacity converter, a necessary number of above-mentioned modules are series-connected in accordance with the rated voltage. Although FIG. 4 shows the case where three GTOs are series-connected in a circuit 50a of one module, the number of series-connected GTOs is not limited to the specific value and can be determined freely. In this embodiment, the number of series-connected modules is selected to be m, and a circuit 50m is the m-th module and has the same circuit structure as the circuit 50a. That is, in the circuit 50a, feedback diodes 2a-2c, diodes 6a-6c of a snubber circuit and capacitors 8a-8c of the snubber circuit are connected in parallel to the GTOs 1a-1c. Energy accumulated on the capacitors 8a-8c of the snubber circuit is fed to a capacitor 9a and to a regenerative circuit 10a through diodes 7a-7c. The operation in FIG. 4 is the same as that in FIG. 1, and the description thereof will be omitted. In a gate drive circuit 12a', a plurality of secondary winding sets are provided by a potential transformer 16b', and respective secondary side outputs are insulated electrically so that gate electric power is transmitted. The gate drive circuit 12a' is substantially equivalent to the gate drive circuit 12a except that the plurality of secondary winding sets are provided in the gate drive circuit 12a'. In this embodiment, only one sub power source can be provided to thereby simplify the circuit structure. Although the embodiments in FIGS. 1 and 4 show the circuit structure in which energy of the anode reactor and the snubber circuit for the GTOs is processed by the regenerative circuit, it is to be understood that the invention is not limited thereto and that the invention can be applied to another circuit structure in which energy accumulated on only the anode reactor circuit or only the snubber circuit for the GTOs is processed by the regenerative circuit.

Figure 5:
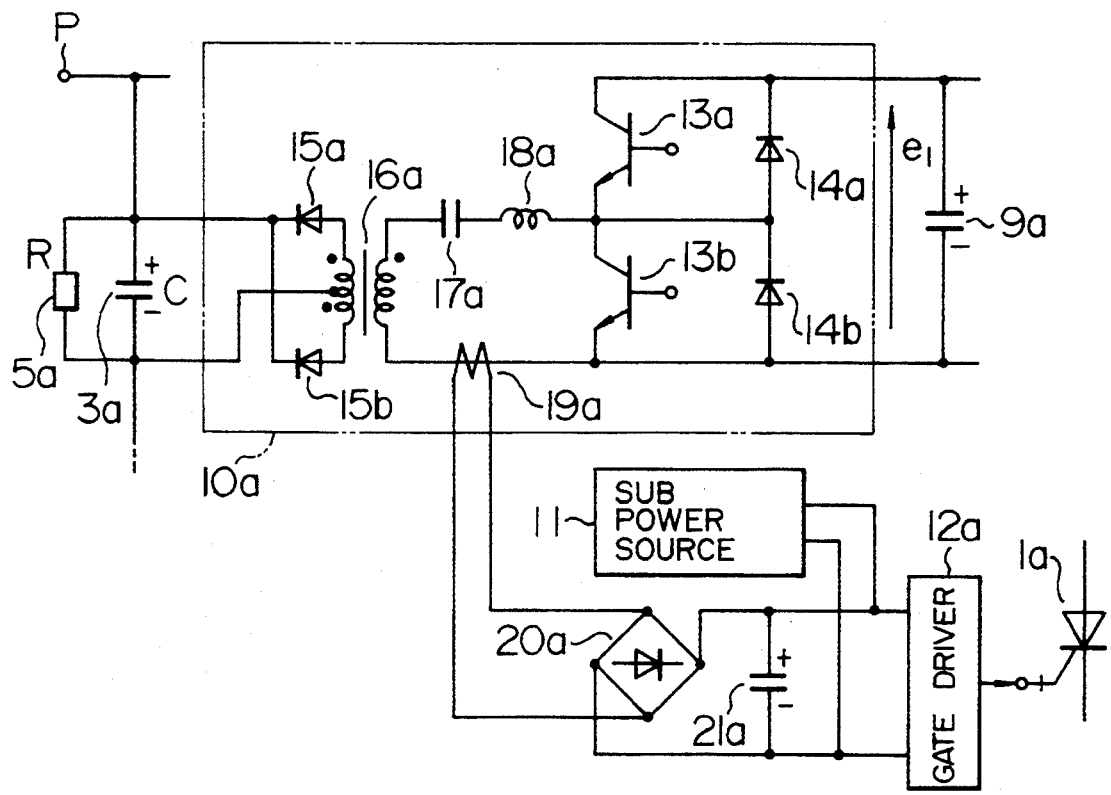
FIG. 5 is a configuration diagram of part of a main circuit of an electric power converter showing a further embodiment of the present invention.

FIG. 5 shows the structure of part of the main circuit according to a further embodiment of the present invention. In the drawing, there is shown the case where the number of series-connected GTOs is one. In each of FIGS. 5 and 2, like numerals refer to like parts. In FIG. 5, a current transformer 19a is provided in the input side of the regenerative circuit 10a. The output of the current transformer 19a is full-wave-rectified by a diode bridge 20a and supplied to a capacitor 21a so that the capacitor 21a is charged. The charge voltage of the capacitor 21a is used as an input to the gate drive circuit 12a. Further, a sub power source 11 is connected to the input side of the gate drive circuit 12a. With respect to the operation in this structure, an input-side alternating current generated by alternatively turning on and off semiconductor switches 13a and 13b of the regenerative circuit 10a is picked out through the current transformer 19a so that the electric power is used as gate power. That is, this embodiment shows the case where current is used as a gate power source, while the embodiment of FIG. 1 shows the case where voltage is used as a gate power source.

In this embodiment, a current transformer which is relatively easy in insulation compared with a potential transformer is used as a gate power pick-out means, so that there arises an advantage in production of parts. Although this embodiment has been described upon the case where the number of series-connected GTOs is one, the invention can be applied to the case where a plurality of series-connected GTOs are provided as one module unit. In this case, the circuit structure can be more simplified because one sub power source 11 can be provided correspondingly to one module as described above.

Figure 6:
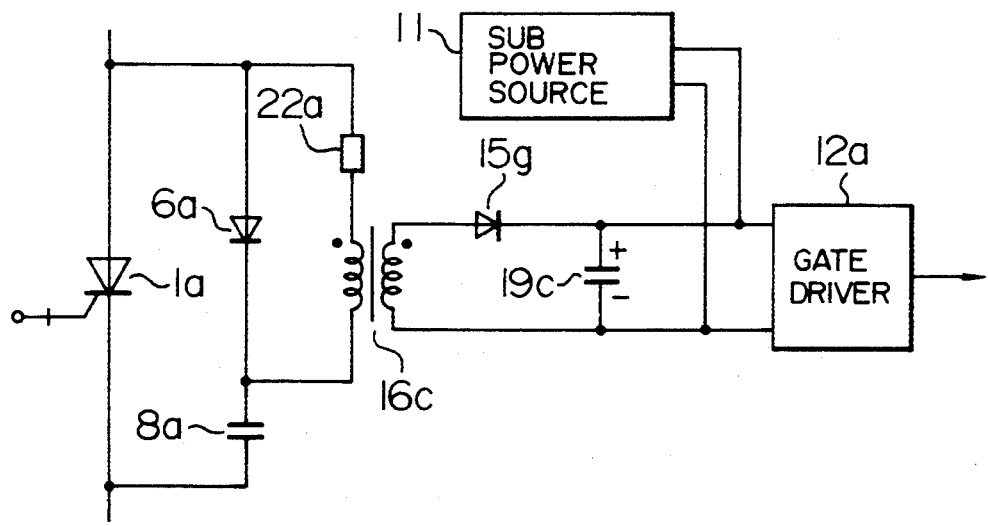
FIG. 6 is a configuration diagram of part of a main circuit of an electric power converter showing a further embodiment of the present invention.

FIG. 6 shows the structure of part of the main circuit according to a further embodiment of the present invention. A snubber circuit is generally formed by connecting a discharge resistor in parallel to a series circuit constituted by a diode and a capacitor as shown in the drawing. In this embodiment, a potential transformer 16c is series-connected to the resistor 22a at one terminal, and the other terminal of the potential transformer 16c is connected to a junction of a diode 6a and a capacitor 8a. The output of the potential transformer 16c is rectified by a diode 15g and supplied to a capacitor 19c so that the capacitor 19c is charged. The charge voltage of the capacitor 19c is used as an input to the gate drive circuit 12a. The drive output of the circuit 12a is connected to the gate of the GTO 1a. The operation in this structure will be described below. A voltage is supplied to the input-side winding of the potential transformer 16c only when the GTO is turned on to thereby discharge the capacitor 8a, because it is bypassed by the diode 6a when the GTO is turned off.

Figure 7:
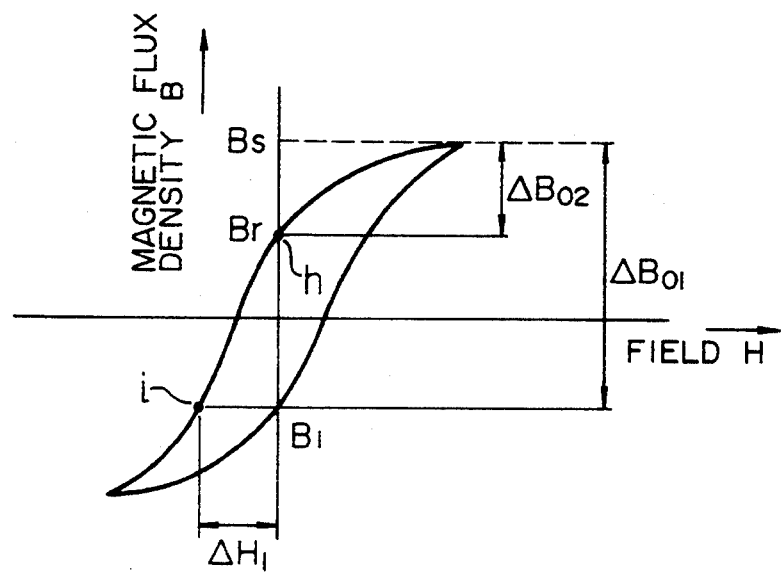
FIG. 7 is a graph for explaining the operation of FIG. 6.

Referring to FIG. 7, this fact will be described. This drawing is a B-H curve graph of an iron core of the potential transformer 16c. In this drawing, when only one-side polarity is excited, flux density can but be used within a range $\Delta B_{02}$ between maximum flux density Bs and residual flux density Br represented by point h, and the iron core is saturated immediately so that sufficient electric power cannot be taken out of the potential transformer. Therefore, when a magnetic field inverse-biased by $\Delta H_1$ is applied to the iron core so as to be shifted to point i, flux density can be used within a range $\Delta B_{01}$ so that larger electric power can be supplied from the potential transformer. For this reason, in this embodiment, the potential transformer 16c uses an iron core in which a material for inverse-biasing the magnetic field is incorporated. In this embodiment, the circuit structure can be simplified because gate electric power can be obtained from a conventional snubber circuit even in the case where there is no regenerative circuit provided specially. Further, larger electric power can be obtained because a potential transformer provided with an iron core having a magnetic field inverse-biasing function is used. Although this embodiment has been described upon the case where a discharge resistor is provided, the invention can be applied to the case where there is no discharge resistor provided.

Figure 8:
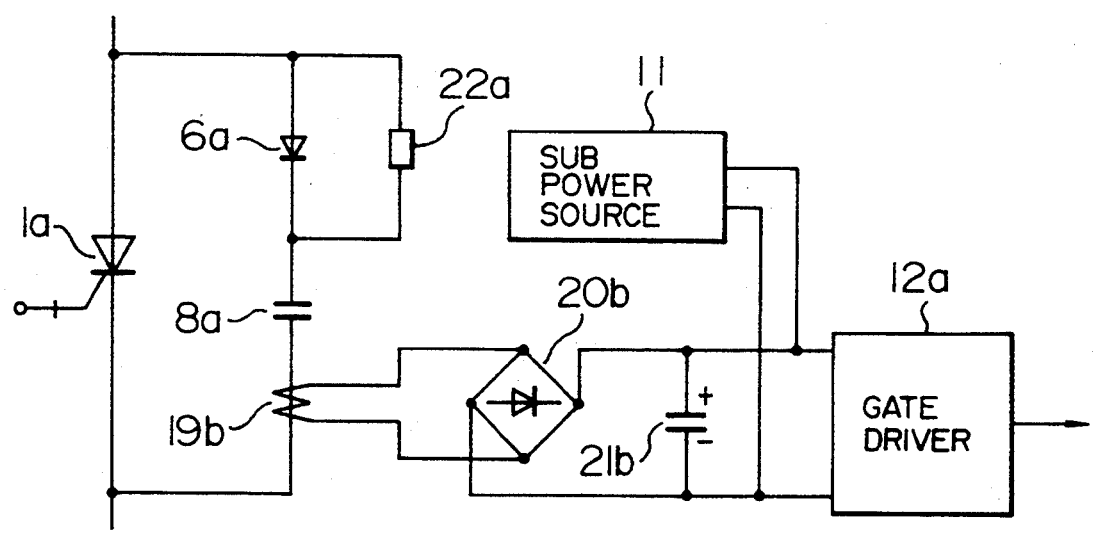
FIG. 8 is a configuration diagram of part of a main circuit of an electric power converter showing a further embodiment of the present invention.

FIG. 8 shows the structure of part of the main circuit according to a further embodiment of the present invention. This drawing shows the case where the number of series-connected GTOs is one. This embodiment shows the case where a current transformer is used for picking out energy of the snubber circuit, while the embodiment of FIG. 6 shows the case where a potential transformer is used. That is, a current transformer 19b is inserted into a conductor connected to the capacitor 8a of the snubber circuit for the GTO 1a. The output of the current transformer 19b is full-wave-rectified by a diode bridge 20b and supplied to a capacitor 21b so that the capacitor 21b is charged. The charge voltage of the capacitor 21b is used as an input to the gate drive circuit 12a. The output of the circuit 12a is connected to the gate of the GTO 1a. In this embodiment, there arises an advantage in production of parts because a current transformer which is relatively easy in electrical insulation compared with the potential transformer is used as a gate power pick-out means as described above. Further, because currents inverted in polarity to each other flow in the current transformer correspondingly to the turning-on and turning-off of the GTO, setting and resetting of the iron core can be performed so that the size of the current transformer can be reduced.

Figure 9:
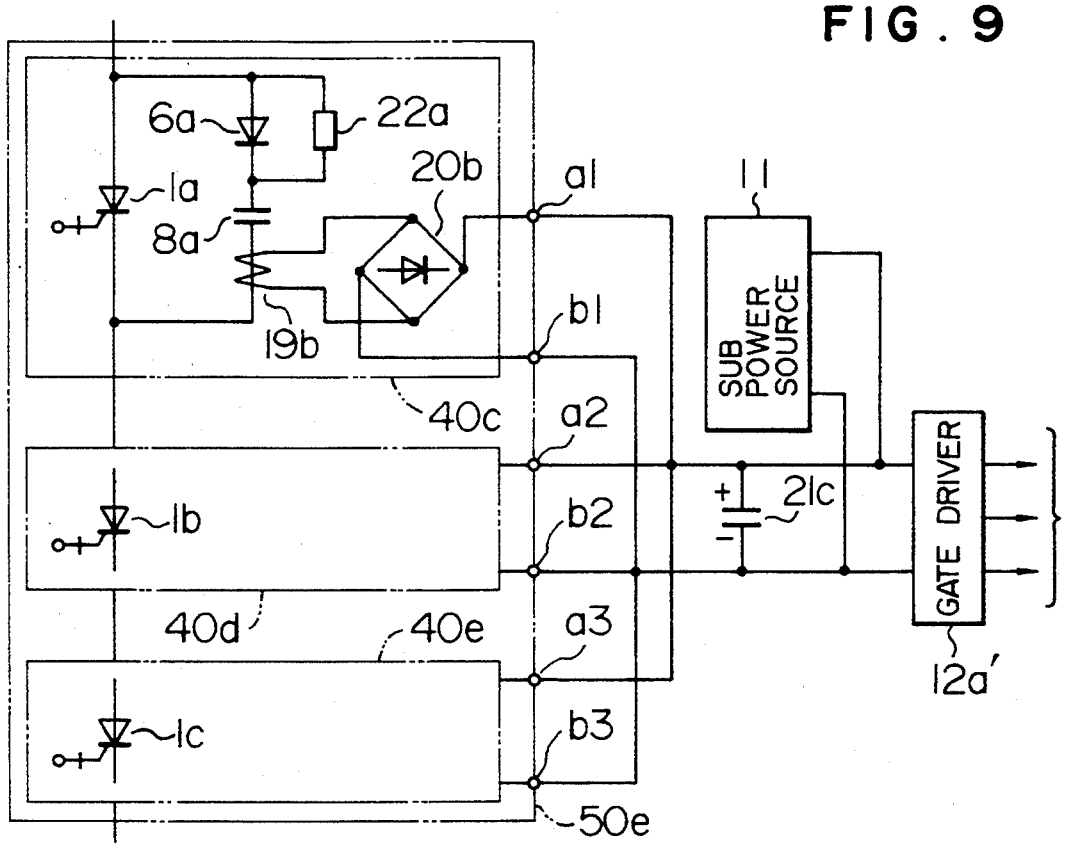
FIG. 9 is a configuration diagram of part of a main circuit of an electric power converter showing a further embodiment of the present invention.

FIG. 9 shows the structure of part of the main circuit according to a further embodiment of the present invention. This embodiment shows the case where a current transformer is used for picking out energy of the snubber circuit in the same manner as in the embodiment of FIG. 8 and where a plurality of GTOs are connected in series. In the drawing, a circuit 50e shows the case of a module constituted by three GTOs connected in series. Circuits 40c–40e have the same circuit structure. In this configuration, positive side terminals a1–a3 and negative side terminals b1–b3 of diode bridge DC outputs of the circuits 40c–40e are connected in parallel to a capacitor 21c. The energy of the capacitor 21c is fed to the respective gates of the GTOs 1a–1c through a gate drive circuit 12a'.

In this embodiment, the circuit structure is simplified because only one sub power source 11 can be provided in the module, compared with the embodiment shown in FIG. 8. Further, because current transformer outputs from the respective GTOs are inputted in parallel to the input-side capacitor of the gate drive circuit, the input voltage of the gate drive circuit is kept constant and accordingly the gate electric power is kept constant compared with the case where gate power is obtained individually from each of the GTOs. This is an important point because the fact meant by this is that partial charge voltages can be made even easily when the GTOs are turned on and off in the case where the GTOs are connected in series.

Figure 10:
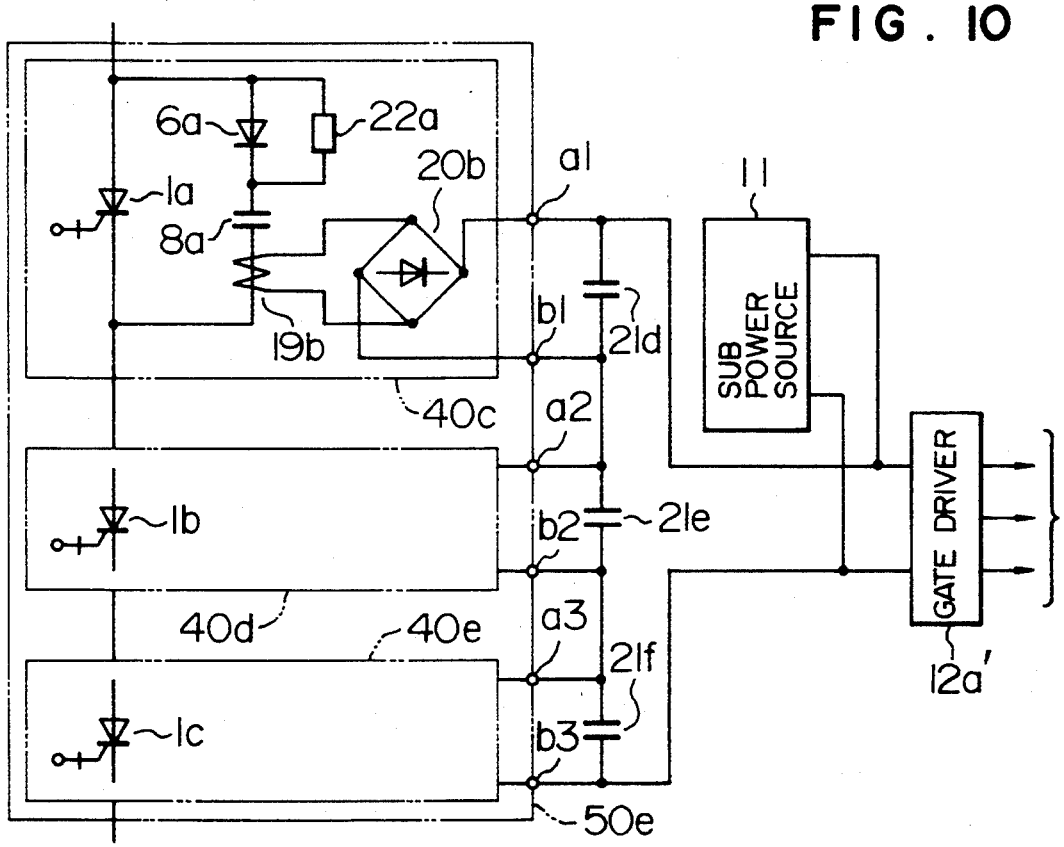
FIG. 10 is a configuration diagram of part of a main circuit of an electric power converter showing a further embodiment of the present invention.

FIG. 10 shows the structure of part of the main circuit according to a further embodiment of the present invention. This embodiment is different from the embodiment of FIG. 9 in that capacitors 21d–21f charged through respective diode bridges are connected in series so that the voltage between opposite terminals of the series-connected capacitors is used as an input to the gate drive circuit 12a'.

In this embodiment, not only the same effect as in the embodiment of FIG. 9 is attained but the following effect is attained. That is, the current transformer picks out a current in the secondary side in the winding ratio (ratio of current transformation) of a certain value so that the capacitors are charged. Assuming now that the winding ratio of the primary side to the secondary side is 1:5, then the primary side voltage is 40 V when the secondary side voltage is 200 V. Because this voltage is added to the anode-cathode voltage of the GTO, the GTO needs durability against a corresponding higher voltage. When current transformer outputs are therefore arranged in parallel as shown in this embodiment, a voltage value obtained by dividing the secondary side voltage by the number of series-connected GTOs (in this embodiment, one third as much as the secondary side voltage) is required in order to obtain the same secondary side voltage as described above. Accordingly, the durability against voltage, of the GTO is lightened.

Figure 11:
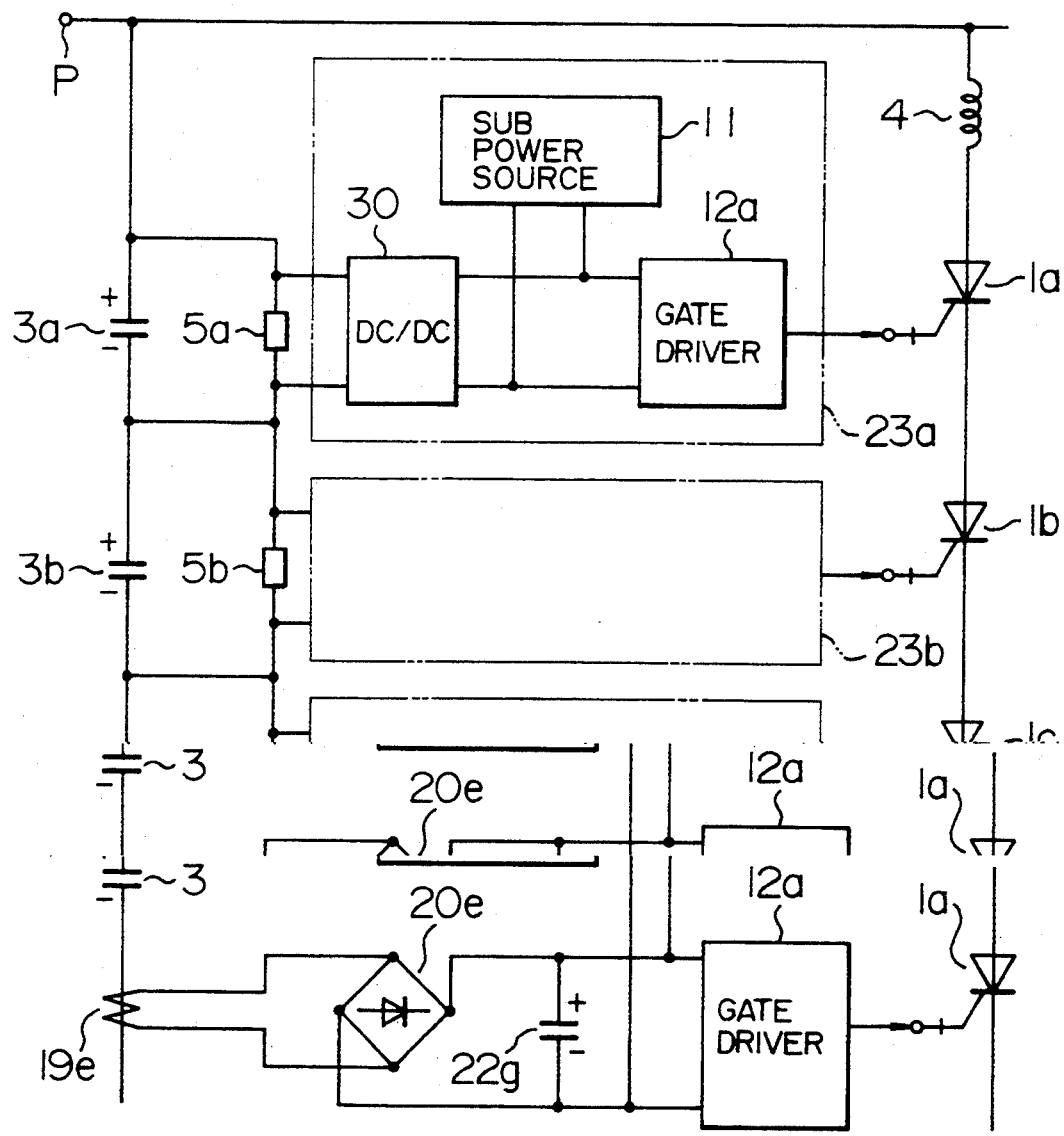
FIG. 11 is a configuration diagram of part of a main circuit of an electric power converter showing a further embodiment of the present invention.

FIG. 11 shows the structure of part of the main circuit according to a further embodiment of the present invention. This embodiment shows the case where a gate drive power source is obtained from a smoothing capacitor correspondingly to one GTO. In this drawing, smoothing capacitors $3a$–$3c$ are provided separately correspondingly to respective GTOs. Resistors $5a$–$5c$ connected in parallel to the smoothing capacitors $3a$–$3c$ respectively are used for dividing a voltage, but there is no necessity of providing the resistors $5a$–$5c$ if the partial charge voltages of the smoothing capacitors are kept even.

Circuits $23a$–$23c$ have the same circuit structure as described above.

In this embodiment, a DC source generated by dividing a DC side DC voltage of the electric power converter is used as an electric source for each of the gate drive circuits for the above-mentioned series-connected GTOs to thereby make it possible to reduce the potential difference between the DC source and the GTO. Accordingly, not only the insulating process in the gate driver including the DC source can be lightened but reduction in size can be attained. Further, because the DC source is obtained from the smoothing capacitor used as a DC input source for the inverter, there arises an effect that electric power can be obtained easily. Although this embodiment shows the case where a gate power source set is provided correspondingly to one GTO, the invention can be applied to the case where one gate power source set is provided correspondingly to a plurality of GTOs connected in series. In this case, the smoothing capacitor is divided correspondingly to the number of units with the plurality of GTOs regarded as one unit. By this division, there is provided an effect that the circuit structure is simplified. Further, the smoothing capacitor is not divided but a capacitor having a smaller value than the smoothing capacitor may be provided as a capacitor for a gate power source correspondingly to one GTO or correspondingly to a plurality of GTOs. In this case, there arises an effect that production can be made more easily than the case where a large-capacity smoothing capacitor is divided.

FIG. 12 shows the structure of part of the main circuit according to a further embodiment of the present invention. This embodiment shows the case where a current flowing out of or into a smoothing capacitor 3 provided in the DC side of the inverter on the basis of the operation of the inverter is picked out by a current transformer 19e to thereby generate a gate drive power source.

As described above, in this embodiment, a current transformer which is relatively easy in insulation compared with a potential transformer is used as a gate power pick-out means, so that there arises an advantage in production of parts. Although this embodiment shows the case where a gate power source set is provided correspondingly to one GTO, the invention can be applied to the case where one gate power source set is provided correspondingly to a plurality of GTOs connected in series. In this case, there arises an effect that the circuit structure is simplified.

As described above, according to the present invention, an electric source for each of the gate drive circuits for the plurality of series-connected semiconductor switching elements is generated from energy accumulated on the reactor and the snubber circuit to thereby eliminate the necessity of supplying electric power from the outside. Accordingly, high efficiency as a whole of the electric power converter can be attained. Furthermore, regardless of the gate drive power source, the potential difference between the power source and the switching element can be reduced. Accordingly, not only the insulating process in the gate driver including the power source can be lightened but reduction in size can be attained.

Further, because the sub power source supplies electric power to the gate drive circuit only at the time of the starting-up of the electric power converter, the capacity thereof can be selected to be small. In the case where a secondary battery is used as the sub power source, the battery is charged by the above-mentioned DC source at the time of constant operation. There arises an effect that no special electric charger is required.

What is claimed is:

1. An electric power converter comprising a plurality of reactors, a plurality of self quenching type switching elements, said reactors and switching elements being series-connected per one arm, and surge-absorbing snubber circuits connected in parallel to said switching elements respectively, said switching circuits being driven by gate drive circuits connected to respective gates of said switching elements to thereby convert a first voltage into a second voltage, wherein said electric power converter further comprises:
means for recovering energy accumulated on at least one side of said reactors and said snubber circuits;
means for generating an electric source for supplying electric power to each of said gate drive circuits, on the basis of said recovered energy; and
means for regenerating energy from said energy recovering means to the electric source on a DC voltage side of said electric power converter.

2. An electric power converter according to claim 1, wherein said electric power converter further comprises a sub power source connected in parallel to said electric source and for supplying electric power to each of said gate drive circuits, and wherein electric power is supplied to said gate drive circuits from said sub power source at the time of the starting-up of said electric power converter.

3. An electric power converter according to claim 2, wherein said sub power source is constituted by a secondary battery, and wherein said battery is charged by energy from said energy recovering means at the time of normal running of said electric power converter.

4. An electric power converter according to claim 1, wherein said regenerating means are provided correspondingly in number thereof to the number of said switching elements constituting said arm so that electric power from said regenerating means is regenerated to each of a plurality of capacitors which are series-connected between positive and negative poles on the DC side of said electric power converter.

5. An electric power converter according to claim 1, wherein said energy recovering means are provided in batch for every arm.

6. An electric power converter according to claim 1, wherein electric power is supplied to said gate drive circuits through current transformers by said energy recovering means.

7. An electric power converter according to claim 1, wherein said first voltage is a DC voltage and said second voltage is an AC voltage.

8. An electric power converter according to claim 1, wherein said first voltage is an AC voltage and said second voltage is a DC voltage.

9. An electric power converter according to claim 1, wherein said electric power source is a DC source.

* * * * *